(12) United States Patent
Aksamit

(10) Patent No.: US 7,262,648 B2
(45) Date of Patent: Aug. 28, 2007

(54) TWO-LATCH CLOCKED-LSSD FLIP-FLOP

(75) Inventor: Randy J. Aksamit, Chandler, AZ (US)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 10/909,382

(22) Filed: Aug. 3, 2004

(65) Prior Publication Data
US 2006/0028259 A1    Feb. 9, 2006

(51) Int. Cl.
*H03K 3/289*    (2006.01)
*H03K 3/356*    (2006.01)
(52) U.S. Cl. .................... 327/202; 327/203; 327/208; 327/218
(58) Field of Classification Search .................... None
See application file for complete search history.

(56) References Cited

U.S. PATENT DOCUMENTS

| | | | | |
|---|---|---|---|---|
| 4,733,405 | A * | 3/1988 | Shimizume et al. | 377/29 |
| 5,469,079 | A * | 11/1995 | Mahant-Shetti et al. | 326/46 |
| 5,633,606 | A * | 5/1997 | Gaudet et al. | 327/202 |
| 5,760,627 | A * | 6/1998 | Gregor et al. | 327/215 |
| 5,784,384 | A * | 7/1998 | Maeno | 714/726 |
| 5,825,224 | A * | 10/1998 | Klass et al. | 327/200 |
| 5,999,030 | A * | 12/1999 | Inoue | 327/202 |
| 6,304,122 | B1 * | 10/2001 | Gregor et al. | 327/202 |
| 6,445,235 | B1 * | 9/2002 | Sachdev | 327/202 |
| 2003/0025543 | A1 * | 2/2003 | Itoh | 327/202 |

* cited by examiner

*Primary Examiner*—Tuan T. Lam

(57) ABSTRACT

A clocked level-sensitive scan design may have flip-flops designed to have data, scan-in, and output ports and to utilize two clock signals. Such a clocked level-sensitive scan flip-flop may be built utilizing two latches.

27 Claims, 5 Drawing Sheets

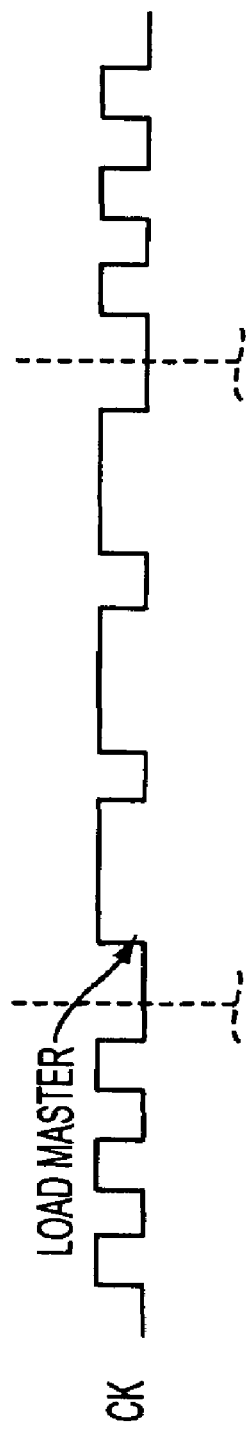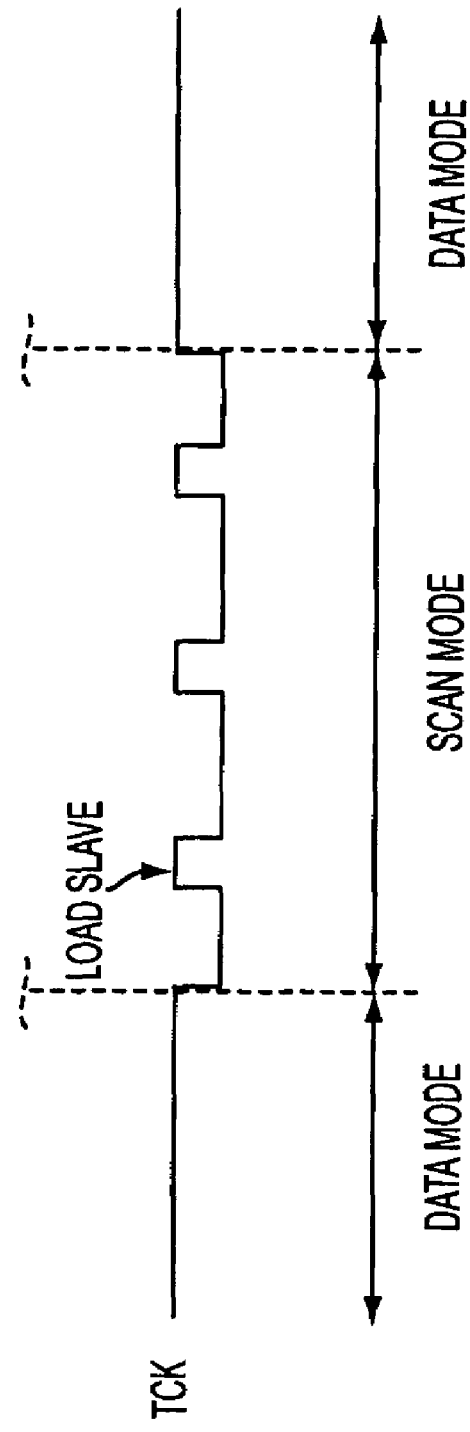

TWO-LATCH CLOCKED-LSSD FLIP-FLOP

BACKGROUND OF THE INVENTION

It is possible to build test hardware into integrated circuit devices, to ease automated testing. Such test hardware may support scan testing and may include, for example, a scan chain and/or a level-sensitive scan design (LSSD). In an LSSD, at least a portion of the test hardware may also be used in normal integrated circuit operation, as well as in testing. Many LSSDs, however, have had the drawback of taking up large die areas. Many types of LSSDs, and in particular clocked LSSDs, may also require several clock signals for operation.

BRIEF DESCRIPTION OF THE DRAWINGS

Various embodiments of the invention will now be described in connection with associated drawings, in which.

DETAILED DESCRIPTION OF EMBODIMENTS OF THE INVENTION

In the following description, numerous specific details are set forth. However, it is understood that embodiments of the invention may be practiced without these specific details. In other instances, well-known circuits, structures, and/or techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1A:
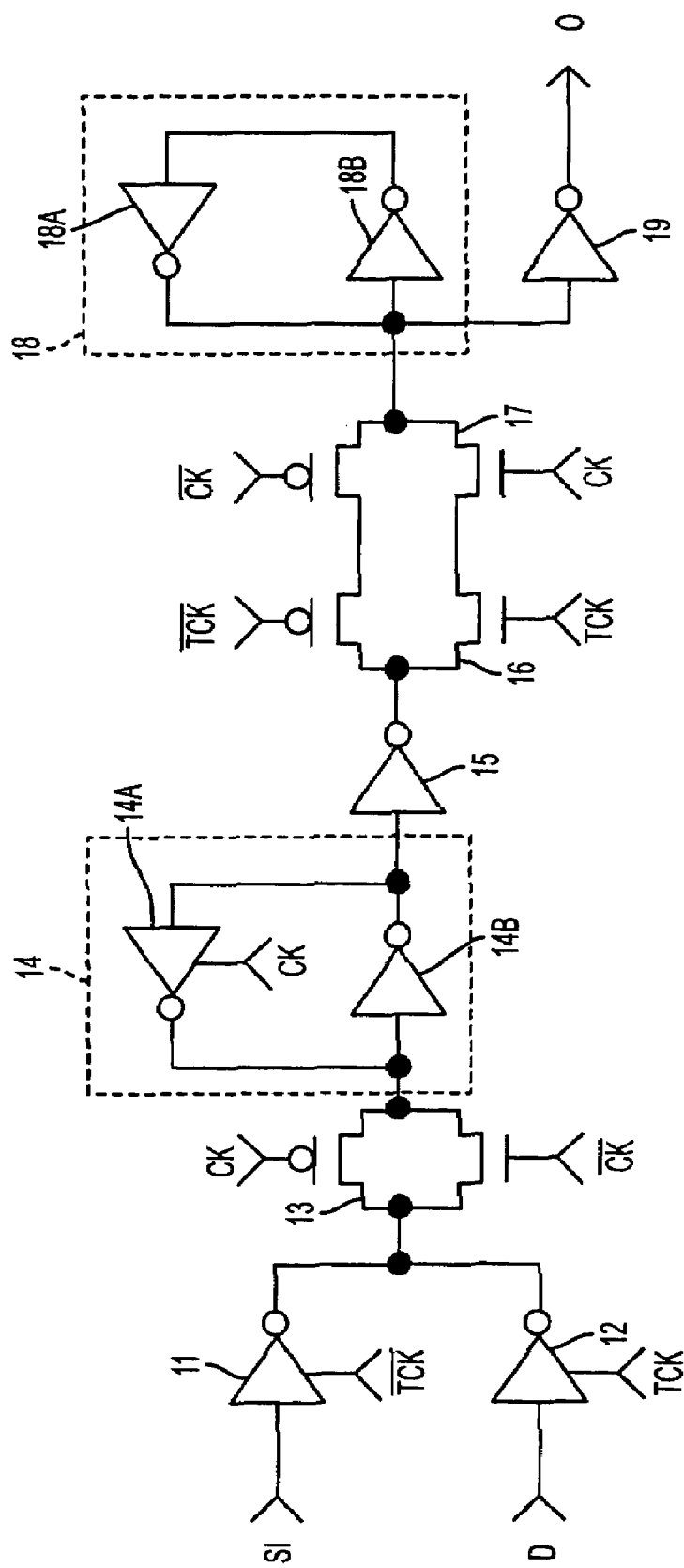
FIG. 1A depicts a circuit diagram of and FIGS. 1B and 1C depict a timing diagram associated with a first embodiment of the invention.

FIG. 1A depicts a circuit diagram showing a clocked LSSD flip-flop according to an embodiment of the invention. The embodiment of FIG. 1A may only require two clock signals, CK ("clock") and TCK ("test clock"), may have two inputs, D ("data") and SI ("scan in"), and may only require a single output O, which may be used as the output for both data mode and scan mode, whichever mode in which the circuit happens to be being used. Note that inverters (not shown) may also be provided to generate the complements, $\overline{CK}$ and $\overline{TCK}$, of the signals, CK and TCK, respectively.

The circuit of FIG. 1A may contain an input portion, which may consist of inverters 11 and 12. Signal SI may be provided as an input to inverter 11, and signal D may be provided as an input to inverter 12. Inverters 11 and 12 may be equipped with enable inputs. TCK may be used as an enable input for inverter 12, and $\overline{TCK}$ may be used as an enable input for inverter 11. The effect of this is that the test clock, TCK, may act as a selection signal to select which input inverter, 11 or 12, may be enabled at any given time. If TCK is high, then inverter 12 may be selected, and D may be input. If TCK is low, then inverter 11 may be selected, and SI may be input (for scan mode).

Whichever signal is selected as input, D or SI, may then be fed to a pass gate 13. Pass gate 13 may have as control inputs CK and $\overline{CK}$. Such a pass gate 13 may be constructed out of a PMOS transistor and an NMOS transistor, as shown, where the PMOS transistor may permit a signal to pass through when its gate signal (here, CK) is low, and the NMOS transistor may permit a signal to pass through when its gate signal (here, $\overline{CK}$) is high. Therefore, when CK is high, no signal may pass through pass gate 13, and when CK is low, a signal may pass through pass gate 13.

A signal that passes through pass gate 13 may then be fed to a first, or "master," latch 14. Latch 14, in the embodiment of FIG. 1A, may comprise two inverters 14A and 14B, which may be connected in a feedback configuration, as shown. One having ordinary skill in the art would understand, however, that latch 14 is not limited to the embodiment shown in FIG. 1A and that alternative implementations may be possible. In the implementation of latch 14 shown in FIG. 1A, inverter 14A may be equipped with an enable input, to which CK may be fed as an enable signal. As a result, in the implementation shown in FIG. 1A, a value is latched into latch 14 only when CK transitions high.

A value stored in latch 14 may then be fed through an inverter 15, and from inverter 15 through pass gates 16 and 17, which form a pass gate assembly. Pass gates 16 and 17 may be constructed in a fashion similar to pass gate 13. Pass gates 16 and 17 may be arranged, as shown in FIG. 1A, such that a signal may be permitted to pass through both gates only when both CK and TCK are high (noting the above discussion in connection with pass gate 13).

The output of pass gate 17 may then be fed into a second ("slave") latch 18. Latch 18 may be constructed out of inverters 18A and 18B, connected in a feedback fashion, as shown in FIG. 1A, or in other ways that may be known to one of ordinary skill in the art. Latch 18 may hold whatever value appears at the output of pass gate 17. This value may also be fed through an inverter 19, whose output, O, may provide an output of the shown embodiment of the invention.

FIGS. 1B and 1C together show a timing diagram that shows how clock signals CK and TCK may be used to implement regular and scan modes in the embodiment of FIG. 1A. In data mode, TCK may be maintained in a high state. This may permit D to be selected as an input signal (to inverter 12), and it may further ensure that pass gate 16 always passes its input signal to pass gate 17. CK may run at a regular rate of oscillation between high and low states. When CK is low, pass gate 13 may pass the signal received from inverter 12 to latch 14, which may latch in the value of the signal when CK transitions to a high state. The value stored in latch 14 may then pass through inverter 15, whose output may, in turn, pass through pass gate 16 (which, as discussed above in connection with TCK, may always pass its input signal) to pass gate 17. Pass gate 17 may permit the value from pass gate 16 to pass through it when CK is high. The value that passes through to the output of pass gate 17 may then be stored in latch 18 and may be output through inverter 19 as output signal O.

In scan mode, TCK may oscillate between high and low states, as shown in FIG. 1C, while CK may also oscillate between high and low states, as shown in FIG. 1B. CK and TCK may be chosen such that they are non-overlapping and are not limited to the clock signals shown in FIGS. 1B and 1C, as would be apparent to one of ordinary skill in the art.

Using the exemplary timing diagram of FIGS. 1B and 1C, operation of the circuit of FIG. 1A may be described as follows. When TCK goes to a low state, scan input SI may be chosen by enabling inverter 11. The resulting data value may then be permitted to pass through pass gate 13 and to be loaded into latch 14 when CK goes to a high state. The value stored in latch 14 may then pass through inverter 15 to the input of pass gate 16. As discussed above, the input to pass gate 16 may only pass through to the output of pass gate 17 and may be loaded into latch 18 when both TCK and CK are in a high state. Hence, in the example of FIGS. 1B and 1C, this may occur when TCK transitions to a high state, as noted by the arrow labeled "Load slave." As a result of these operations, the output signal O may correspond to a scan output. The circuit may reenter the data mode when TCK is again held high.

A problem may arise if the latch 18 is not being fed a value. This may result in a spurious output value that may depend upon what value results, if any, when pass gate 17 is in a quiescent state. A solution to this problem found in one embodiment of the invention may be to design latch 18 with so-called "weak" feedback, so that it holds its value static unless it is actually driven by a (new) input signal value.

Figure 2:
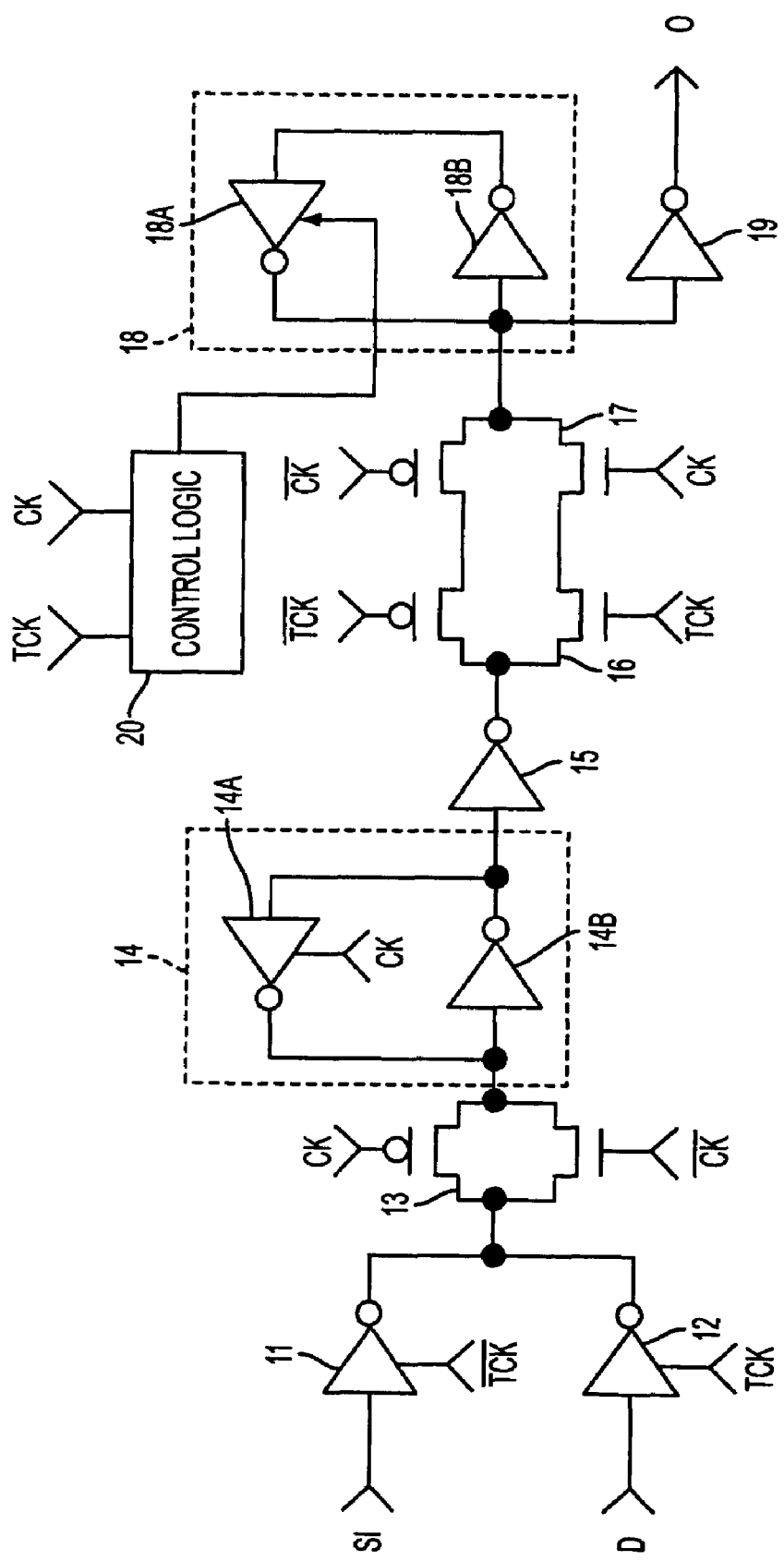
FIG. 2 depicts a circuit diagram of a second embodiment of the invention.

A second solution to the above-described problem may be demonstrated by the embodiment shown in FIG. 2. In FIG. 2, latch 18 may be constructed such that it may be provided with an enable signal (e.g., to inverter 18A). The enable signal provided to latch 18 may be used to ensure that it loads a new value only at desired times, i.e., when a new value is passed to the output of pass gate 17. Such an enable signal may be generated based on CK and TCK, using control logic 20. One of ordinary skill in the art would recognize that there may be many ways to design control logic 20 so as to obtain a desired enable signal. For example, control logic 20 may be designed to provide an enable signal to latch 18 that is complementary to an enable signal provided to pass gates 16 and 17.

It is noted that the various components of FIGS. 1A and 2 may be designed in alternative ways that would be apparent to one of ordinary skill in the art. For example, the various components may be selected such that one or more of the pass gates pass signals when the clock polarities are the opposite of those described above.

Furthermore, the principles of the invention may be applicable to other flip-flop designs to convert them to clocked-LSSD flip-flops by adding an additional joint clock/control signal (similar to TCK in the embodiments described above) and any necessary associated control logic to such other flip-flop designs. In general, embodiments of the invention may use a single signal as a clock/control signal that selects input data versus a scan value and to delay operation of, for example, a slave latch or other downstream storage component of the flip-flop (e.g., in a master-slave-type design having first and second storage portions (which may be latches)).

Figure 4:
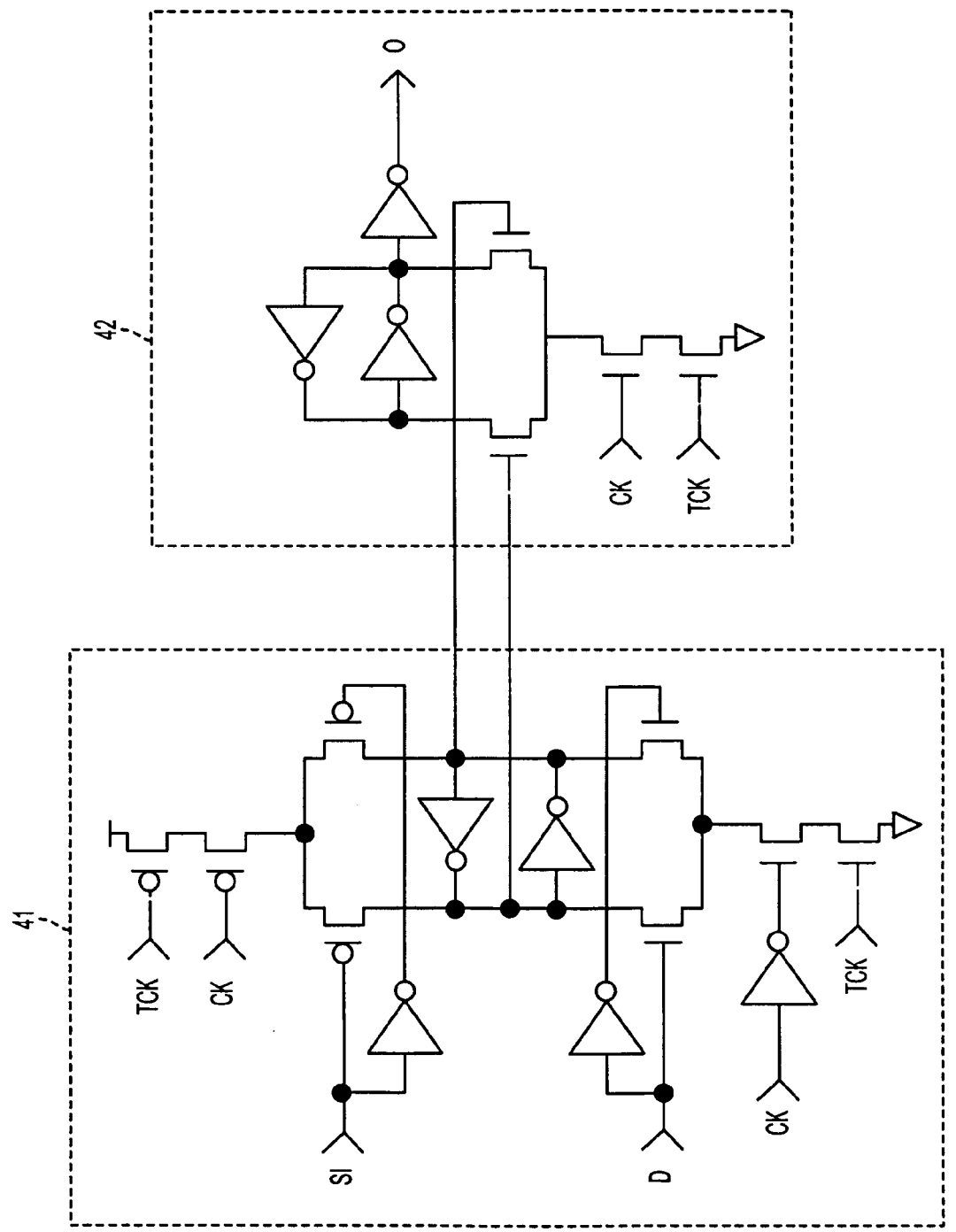
FIG. 4 depicts a circuit diagram of a third embodiment of the invention.

FIG. 4 shows an example of such an alternative embodiment. The embodiment of FIG. 4 may, once again, have master 41 and slave 42 latch portions. This embodiment may use a differential pull-down approach to loading data. However, as in the above embodiments, TCK may be used to select whether D or SI is used as input, and there may, once again, be a single output O, for both data and scan modes. In general, the embodiment of FIG. 4 may operate in a functionally similar fashion to the embodiment shown in FIG. 1A and as described above.

Figure 3:
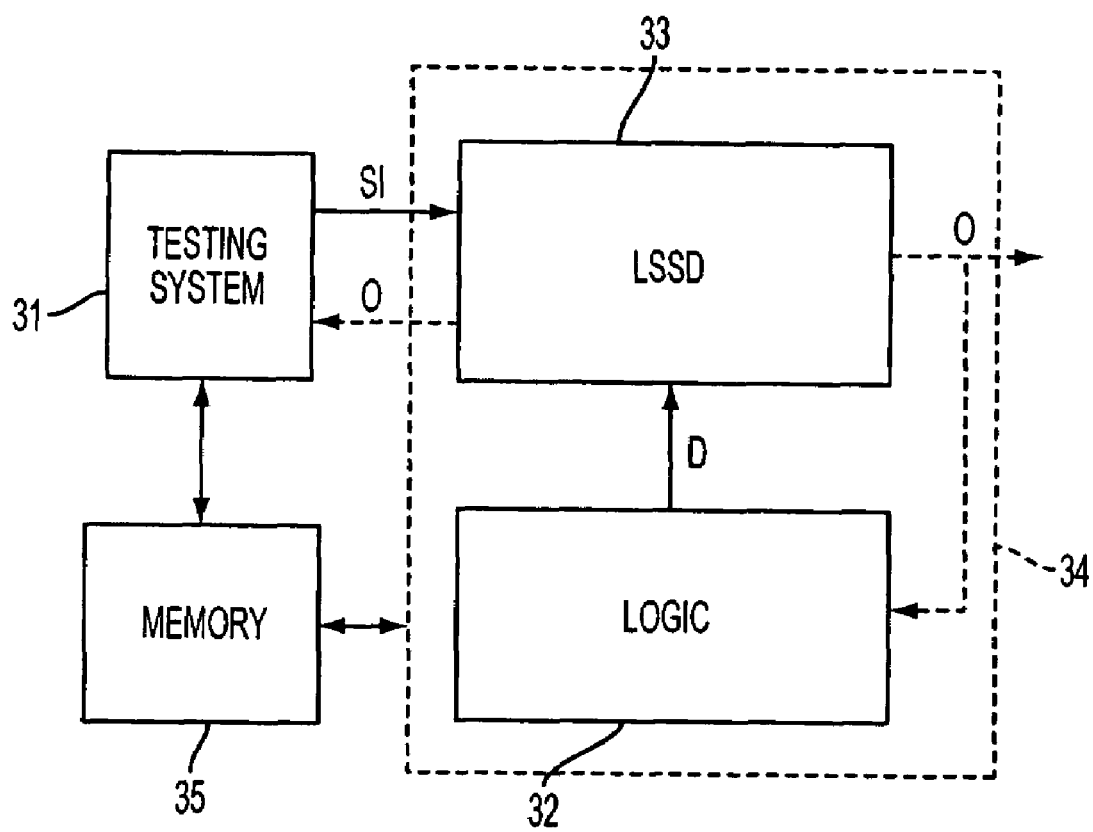
FIG. 3 depicts a block diagram of a system according to a further embodiment of the invention.

The invention may also be embodied as part of a larger device and/or system, as shown in FIG. 3. The inventive clocked LSSD flip-flop, for example, as described in connection with FIGS. 1A-1C and/or FIG. 2 and/or FIG. 4, may be incorporated into LSSD 33 of FIG. 3. LSSD 33 may interface with additional logic 32 found on a common chip or within a common system 34. Such additional logic 32 may include, but is not limited to, memory, combinational logic, and/or a processor. Logic 32 may provide LSSD 33 with data (D), for which a corresponding output (O) may be generated at the output of LSSD 33 (and which may be fed back to logic 32, if desired). LSSD 33 may also interface with a testing system 31. Testing system 31 may reside at least partially on a common chip or within a common system 34, or it may be totally external to the chip or system 34. Testing system 31 may be used to provide a scan input (SI) to LSSD 33, which may then provide an associated scan output (O) back to testing system 31. In this fashion, testing system 31 may perform diagnostic testing of the chip or system 34. The embodiment of FIG. 3 may further include a memory 35, which may be coupled to testing system 31, LSSD 33, and/or logic 32.

The invention has been described in detail with respect to various embodiments, and it will now be apparent from the foregoing to those skilled in the art that changes and modifications may be made without departing from the invention in its broader aspects. The invention, therefore, as defined in the appended claims, is intended to cover all such changes and modifications as fall within the true spirit of the invention.

What is claimed is:

1. An apparatus, comprising:

an input portion to select a data input based on a first state of a clock/control signal and a scan input based on a second state of the clock/control signal to store in a first storage portion in response to a clock signal different from the clock/control signal, wherein the clock/control signal has different signal types corresponding to different modes of operation of the apparatus, wherein one of the signal types of the clock/control signal is a periodic signal; and a second storage portion coupled to the first storage portion to store, based on the clock/control signal and the clock signal, a value provided at an input to the second storage portion.

2. The apparatus according to claim 1, wherein the input portion is integrated with the first storage portion.

3. The apparatus according to claim 1, wherein the input portion and the first storage portion are distinct from each other, the apparatus further comprising:

a first pass gate assembly interposed between the input portion and the first storage portion to permit a signal to pass through, responsive at least to the clock signal; and a second pass gate assembly interposed between the first storage portion and the second storage portion to permit a signal to pass through, based on the clock/control signal and the clock signal.

4. The apparatus according to claim 3, further comprising: an inverter coupled to the second pass gate assembly to provide an output signal from the apparatus.

5. The apparatus according to claim 3, further comprising: an inverter having an input coupled to an output of the first storage portion and an output coupled to an input to the second pass gate assembly.

6. The apparatus according to claim 3, wherein the second pass gate assembly comprises:
a pass gate coupled to an output of the first storage portion to permit a signal to pass through when the clock/control signal assumes a first clock/control state; and
a second pass gate connected to an output of the second pass gate to permit a signal to pass through when the clock signal assumes a predetermined clock state.

7. The apparatus according to claim 3, wherein the first pass gate assembly comprises:
a pass gate coupled to an output of the input portion to permit a signal to pass through based at least on the clock signal.

8. The apparatus according to claim 1, wherein the clock/control signal and the clock signal are non-overlapping.

9. The apparatus according to claim 1, wherein each of the first and second storage portions comprises a latch.

10. An apparatus, comprising:
an input portion to select, based on a state of a clock/control signal, one of a set of inputs consisting of a data input and a scan input to store in a first storage portion in response to a clock signal different from the clock/control signal; and
a second storage portion coupled to the first storage portion to store, based on the clock/control signal and the clock signal, a value provided at an input to the second storage portion, wherein the second storage portion comprises an enable input to permit storage of the input to the second storage portion when the enable input assumes a predetermined state.

11. The apparatus according to claim 10, further comprising:
control logic, coupled to the clock/control signal and to the clock signal, to generate the enable input.

12. A device comprising:
a clocked level-sensitive scan design (LSSD) flip-flop (FF) having information inputs and outputs including:
a data input;
a scan input; and
an output to use as both a data output and a scan output;
wherein the clocked LSSD FF is to utilize no more than two clock signals, wherein one of the clock signals is to function as a joint clock/control signal having different signal types corresponding to different modes of operation of the device, wherein one of the signal types of the joint clock/control signal is a periodic signal, and wherein the data input is selected based on a first state of the joint clock/control signal and the scan input is selected based on a second state of the joint clock/control signal.

13. The device according to claim 12, comprising no more than two storage portions, wherein a first one of the two storage portions is adapted to accept as an input value either the data input or the scan input, and wherein a second one of the two storage portions is coupled to the first one of the two storage portions.

14. The device according to claim 13, wherein the second one of the two storage portions is adapted to accept as an input value an inverted version of a value stored in the first one of the two storage portions when both of the two clock signals assume a common state.

15. The device according to claim 12, wherein the clock signals are non-overlapping.

16. A system comprising:
a logic portion providing at least one data output;
an input portion to select a data input based on a first state of a clock/control signal and a scan input based on a second state of the clock/control signal to store in a first storage portion in response to a clock signal different from the clock/control signal, wherein the clock/control signal has different signal types corresponding to different modes of operation of the system, wherein one of the signal types of the clock/control signal is a periodic signal;
a second storage portion coupled to the first storage portion to store, based on the clock/control signal and the clock signal, a value provided at an input to the second storage portion; and
a memory.

17. The system according to claim 16, further comprising:
a first pass gate assembly interposed between the input portion and the first storage portion to permit a signal to pass through, responsive at least to the clock signal; and
a second pass gate assembly interposed between the first storage portion and the second storage portion to permit a signal to pass through, based on the clock/control signal and the clock signal.

18. The system according to claim 17, further comprising:
a test portion to be coupled to the scan input and to be coupled to an output of the second pass gate assembly.

19. The system according to claim 17, further comprising:
an inverter coupled to an output of the second pass gate assembly to provide a system output.

20. A method comprising:
providing an input portion to accept a data input based on a first state of a clock/control signal and a scan input based on a second state of the clock/control signal to store in a first storage portion based on a state of a clock signal, wherein the clock/control signal has different signal types corresponding to different modes of operation, wherein one of the signal types of the clock/control signal is a periodic signal; and
providing a second storage portion coupled to the first storage portion to store a value based on states of both the clock signal and the clock/control signal.

21. The method according to claim 20, further comprising:
providing a first pass gate portion to be interposed between the input portion and the first storage portion, under control of the clock signal, to provide a value to the first storage portion; and
providing a second pass gate portion to be interposed between the first storage portion and the second storage portion, under control of the clock signal and the clock/control signal, to provide a value to the second storage portion.

22. A method comprising:
providing an input portion to accept as inputs a scan input and a data input and to select one of the inputs based on a state of a clock/control signal to store in a first storage portion based on a state of a clock signal;
providing a second storage portion coupled to the first storage portion to store a value based on states of both the clock signal and the clock/control signal; and
providing control logic to generate an enable signal to control the second storage portion the enable signal based at least in part on the clock signal and the clock/control signal.

23. An apparatus, comprising:
an input means for selecting a data input based on a first state of a clock/control signal, and a scan input based on a second state of the clock/control signal,
a means for storing information in a first storage means in response to a clock signal different from the clock/control signal, wherein the clock/control signal has different signal types corresponding to different modes of operation of the apparatus, wherein one of the signal types of the clock/control signal is a periodic signal; and
a second storage means coupled to the first storage means for storing, based on the clock/control signal and the clock signal, a value provided at an input to the second storage means.

24. The apparatus according to claim 23, wherein the input means for selecting is integrated with the first storage means.

25. The apparatus according to claim 23, further comprising:
a first pass gate means interposed between the input means for selecting and the first storage means to permit a signal to pass through, responsive at least to the clock signal; and
a second pass gate means interposed between the first storage means and the second storage means to permit a signal to pass through, based on the clock/control signal and the clock signal.

26. An apparatus, comprising:
an input means for selecting, based on a state of a clock/control signal, one of a set of inputs consisting of a data input and a scan input to store in a first storage means in response to a clock signal different from the clock/control signal; and
a second storage means coupled to the first storage means to store, based on the clock/control signal and the clock signal, a value provided at an input to the second storage means, wherein the second storage means comprises an enable input to permit storage of the input to the second storage means when the enable input assumes a predetermined state.

27. The apparatus according to claim 26, further comprising:
control means, coupled to the clock/control signal and to the clock signal, to generate the enable input.

* * * * *